(12) United States Patent
Yen et al.

(10) Patent No.: US 8,815,679 B1
(45) Date of Patent: Aug. 26, 2014

(54) STRUCTURE OF METAL GATE MIM

(71) Applicant: Taiwan Semiconductor Manufacturing Company, Ltd., Hsin-Chu (TW)

(72) Inventors: Hsiu-Jung Yen, Shuishang Township (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/905,856

(22) Filed: May 30, 2013

Related U.S. Application Data (60) Provisional application No. 61/778,317, filed on Mar. 12, 2013.

(51) Int. Cl.
*H01L 21/8242* (2006.01)

(52) U.S. Cl.
USPC ............... 438/244; 438/396; 257/E21.021

(58) Field of Classification Search
USPC ........................................... 438/171
See application file for complete search history.

(56) References Cited

U.S. PATENT DOCUMENTS

2006/0118841 A1* 6/2006 Eliason et al. ............... 257/295

* cited by examiner

*Primary Examiner* — Cheung Lee
(74) *Attorney, Agent, or Firm* — Slater and Matsil, L.L.P.

(57) ABSTRACT

First and second multi-layer structures are formed within respective openings in at least one dielectric layer formed over a semiconductor substrate. The first multi-layer structure comprises a gate electrode, and the second multi-layer structure comprises a resistor and a first electrode of a metal-insulator-metal (MIM) capacitor structure. The MIM capacitor structure is completed by forming a dielectric film on the at least one dielectric layer and forming a second electrode on the dielectric film.

20 Claims, 6 Drawing Sheets

STRUCTURE OF METAL GATE MIM

This application claims the benefit of U.S. Provisional Application No. 61/778,317, filed Mar. 12, 2013 entitled "A Novel Structure of Metal Gate MIM," which application is hereby incorporated herein by reference.

BACKGROUND

In the manufacture of integrated circuits, resistors are often formed during "front end of the line" (FEOL) processing, whereas capacitors are often formed during "back end of the line" (BEOL) processing. Interconnection of such resistors and capacitors is accomplished by a complicated series of conductive traces and vias formed in multiple layers of interlayer dielectric materials as part of the BEOL processing. Thus, interconnection of the FEOL resistors and BEOL capacitors requires multiple masks utilized during the multiple deposition and etching processes conventionally utilized during BEOL processing.

BRIEF DESCRIPTION OF THE DRAWINGS

For a more complete understanding of the present embodiments, and the advantages thereof, reference is now made to the following descriptions taken in conjunction with the accompanying drawings, in which.

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed except where specifically noted as indicating a relationship. Moreover, the formation of a first feature over or on a second feature in the description that follows may include embodiments in which the first and second features may be formed in direct contact, and may also include embodiments in which additional features may be formed interposing the first and second features, such that the first and second features may not be in direct contact.

One or more aspects of the present disclosure are presented in the context of manufacturing microelectronic devices comprising one or more transistors, resistors, and/or capacitors forming one or more integrated circuits. However, one or more aspects of the present disclosure may also be applicable or readily adaptable to other microelectronic devices of like construction, such as logic gates, inverters, P-type metal oxide semiconductor (PMOS) devices (e.g., for pull-up transistors), and N-type metal oxide semiconductors (NMOS) devices (e.g., for pull-down transistors), among others.

Figure 1:
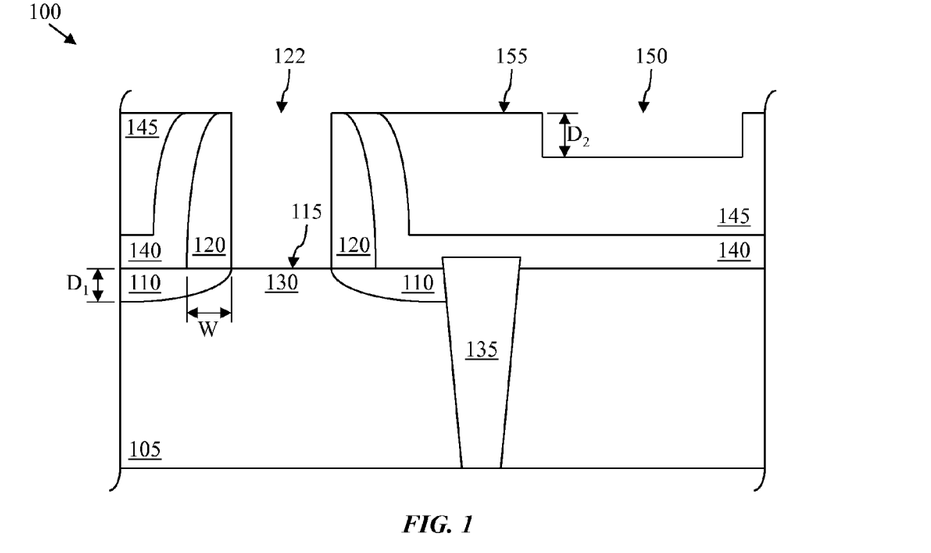
FIG. 1 is a schematic view of at least a portion of apparatus in an intermediate stage of manufacture according to one or more aspects of the present disclosure.

FIG. 1 is schematic view of at least a portion of an apparatus 100 in an intermediate stage of manufacture according to one or more aspects of the present disclosure. The apparatus 100 is fabricated from/on a substrate 105, which may comprise bulk silicon, strained silicon, silicon germanium, and/or other materials. The substrate 105 may also be or comprise a silicon-on-insulator (SOI) substrate, such as a silicon-on-sapphire substrate, a silicon germanium-on-insulator substrate, and/or another substrate comprising an epitaxial semiconductor layer on an insulator layer. However, the substrate 105 may comprise additional or alternative materials within the scope of the present disclosure. The substrate 105 may have a <100>, <110>, <111>, or other surface orientation. The substrate 105 may also comprise one or more isolation structures 135, such as shallow trench isolation (STI) features and/or local oxidation of silicon (LOCOS) features, among others. The isolation structures 135 may be flush with the substrate 105, or may protrude slightly above the substrate 105, as shown in FIG. 1.

The substrate 105 also comprises source/drain regions 110 and one or more spacers 120. The source/drain regions 110 are formed in and/or near the upper surface 115 of the substrate 105. For example, the source/drain regions 110 may be formed by ion implantation, perhaps utilizing a dummy gate electrode (not shown) as a mask, and thereby defining a channel region 130 in the semiconductor substrate 105 between the source/drain regions 110. The source/drain regions 110 may comprise p-type and/or n-type impurities, such as phosphorus, arsenic, boron, and/or other materials. Subsequent diffusion, annealing, and/or electrical activation processes may also be employed after implantation. Fabrication of the source/drain regions 110 may utilize an energy level ranging between about five keV and about 40 keV and a dose ranging between about $1 \times 10^{13}$ cm-2 and about $5 \times 10^{15}$ cm-2, although other energy levels and doses are also within the scope of the present disclosure. A subsequent rapid thermal anneal process, perhaps in excess of 1000 degrees Centigrade, may additionally be performed. Although not shown, the source/drain regions 110 may also comprise silicide regions formed by depositing a metal layer that is then annealed and/or otherwise caused to react with silicon of the substrate 105. The maximum depth D1 of the source/drain regions 110 may be about 200 angstroms, although other depths are also within the scope of the present disclosure.

The spacers 120 may comprise one or more spacers substantially extending around the dummy gate electrode, such that the spacers 120 extend around the perimeter of an opening 122 formed by removing the dummy gate electrode. In this context, reference hereafter to multiple spacers 120 includes embodiments in which one or more such wrap-around spacers may be employed. The spacers 120 may comprise one or more layers of silicon nitride, silicon oxide, silicon oxynitride, a combination thereof, and/or other materials. Forming the spacers 120 around the dummy gate electrode may comprise low pressure chemical vapor deposition, rapid thermal chemical vapor deposition, atomic layer chemical vapor deposition, and/or plasma enhanced chemical vapor deposition (hereafter collectively referred to as CVD), perhaps utilizing tetraethyl orthosilicate and oxygen as a precursor. The spacers 120 may also be formed by an oxidation process, such as wet or dry thermal oxidation in an ambient environment comprising an oxide, water, nitric oxide, or a combination thereof, and/or other processes. Fabrication of the spacers 120 may also comprise chemical-mechanical polishing or planarizing (hereafter collectively referred to as CMP), isotropic etching, and/or anisotropic etching. The width W of the spacers 120 may range between about 50 angstroms and about 400 angstroms, although other widths are also within the scope of the present disclosure.

The apparatus 100 also comprises a contact etching stop layer 140. The contact etching stop layer 140, which may be embodied in a high stress film, may be utilized to create a tensile stress along the <100> and/or another direction. The contact etching stop layer 140 may comprise silicon nitride and/or other tensile stress material, and may be formed by CVD and/or other processes. The contact etching stop layer 140 may be formed over the spacers 120, the dummy gate electrode, and at least a portion of the substrate 105, such as over the source/drain regions 110 and/or one or more of the isolation structures 135. Subsequent CMP processing may expose the dummy gate electrode, such that one or more etching and/or other processes may remove the dummy gate electrode to form the opening 122. The contact etching stop layer 140 may exert a tensile stress in the range of about 50 mega Pascals to about 2.0 giga Pascals along the source-to-drain direction. The thickness of the contact etching stop layer 140 may range between about 300 angstroms and about 1000 angstroms, although other thicknesses are also within the scope of the present disclosure.

The apparatus 100 also comprises one or more interlayer dielectric layers 145 overlying at least portions of the contact etching stop layer 140. The one or more interlayer dielectric layers 140 may comprise silicon oxide, BLACK DIAMOND (a product of Applied Materials of Santa Clara, Calif.), and/or other materials, and may be formed by CVD, sputtering, spin-on coating, and/or other processes. The one or more interlayer dielectric layers 145 may be deposited on the contact etching stop layer 140 prior to the above-described CMP process, such that the portion of the one or more interlayer dielectric layers 145 proximate the spacers 120 may be flush with the upper extent of the spacers 120 and the portions of the contact etching stop layer 140 that interpose the spacers 120 and the one or more interlayer dielectric layers 145. Accordingly, a substantially planar upper surface 155 may comprise portions of the one or more interlayer dielectric layers 145, the contact etching stop layer 140, and the spacers 120. The thickness of the one or more interlayer dielectric layers 145 over the laterally extending portions of the contact etching stop layer 140 may range between about 1500 angstroms and about 8000 angstroms, although other thicknesses are also within the scope of the present disclosure.

As also shown in FIG. 1, an opening 150 is also formed in the upper surface 155, such as by chemical etching, plasma etching, focused ion beam (FIB) processing, and/or other processes. Such processing may be employed to remove material from the one or more interlayer dielectric layers 145 to a depth extending only partially into the one or more interlayer dielectric layers 145, and thus not extending to the surface 115 of the substrate. For example, the depth D2 of the opening 150 may range between about 250 angstroms and about 1500 angstroms, although other depths are also within the scope of the present disclosure, including embodiments in which the opening 150 extends through the one or more interlayer dielectric layers 145 to the contact etching stop layer 140, or even to the surface 115 of the substrate 105. The opening 150 may be formed substantially simultaneously with one or more of the processing steps described above. For example, the etching and/or other processing utilized to remove the dummy gate electrode and thus form the opening 122 between the spacers 120 may also be utilized to form the opening 150. However, the opening 150 may also be formed by its own dedicated processing, which may comprise fabrication of a mask on the surface 155 of the one or more interlayer dielectric layers 145 and subsequent etching utilizing such mask.

Figure 2:
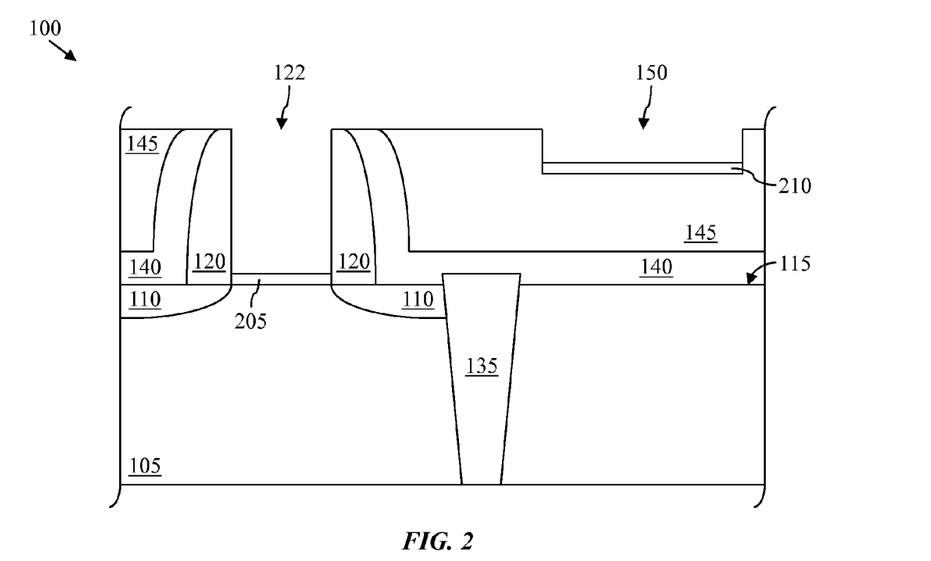
FIG. 2 is a schematic view of the apparatus shown in FIG. 1 in a subsequent stage of manufacture according to one or more aspects of the present disclosure.

FIG. 2 is a schematic view of the apparatus 100 shown in FIG. 1 in a subsequent stage of manufacture according to one or more aspects of the present disclosure. The apparatus 100 also comprises a dielectric film 205 at the bottom of the opening 122 and another dielectric film 210 at the bottom of the opening 150. The dielectric films 205 and 210 may have a relative permittivity value greater than about four, and may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric films 205 and 210 may be formed by epitaxial growth, deposition, and/or other processes. For example, the dielectric films 205 and 210 may be formed by an oxidation process such as wet or dry thermal oxidation in an ambient environment with an oxide, water, nitric oxide, or a combination thereof, or by chemical vapor deposition techniques utilizing tetraethyl orthosilicate and oxygen as a precursor. The thickness of the dielectric films 205 and 210 may range between about eight angstroms and about 200 angstroms, although other thicknesses are also within the scope of the present disclosure. The dielectric films 205 and 210 may be formed substantially simultaneously or during separate processes, and may have substantially similar or different thicknesses.

Figure 3:
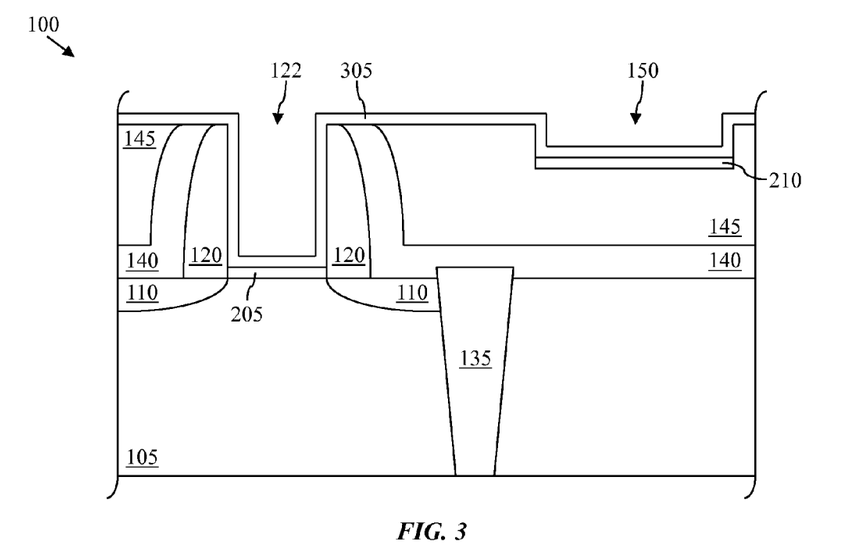
FIG. 3 is a schematic view of the apparatus shown in FIG. 2 in a subsequent stage of manufacture according to one or more aspects of the present disclosure.

FIG. 3 is a schematic view of the apparatus 100 shown in FIG. 2 in a subsequent stage of manufacture according to one or more aspects of the present disclosure. The apparatus 100 also comprises a first structural layer 305 formed over the one or more interlayer dielectric layers 145 and the exposed portions of the contact etching stop layer 140 and the spacers 120. The first structural layer 305 also lines the internal surfaces of the opening 122, including along the interior walls of the spacers 120 and on the dielectric film 205. The first structure layer 305 also lines the internal surfaces of the opening 150, including along the interior walls of the opening 150 and on the dielectric film 210. The first structural layer 305 may comprise one or more of titanium nitride, tantalum nitride, titanium, titanium aluminum, hafnium oxide, lanthanum oxide, silicon oxide, silicon nitride, and silicon oxynitride, although other materials are also within the scope of the present disclosure. The first structural layer 305 may be formed by CVD and/or other processes, and may have a thickness ranging between about ten angstroms and about 200 angstroms, although other thicknesses are also within the scope of the present disclosure.

Figure 4:
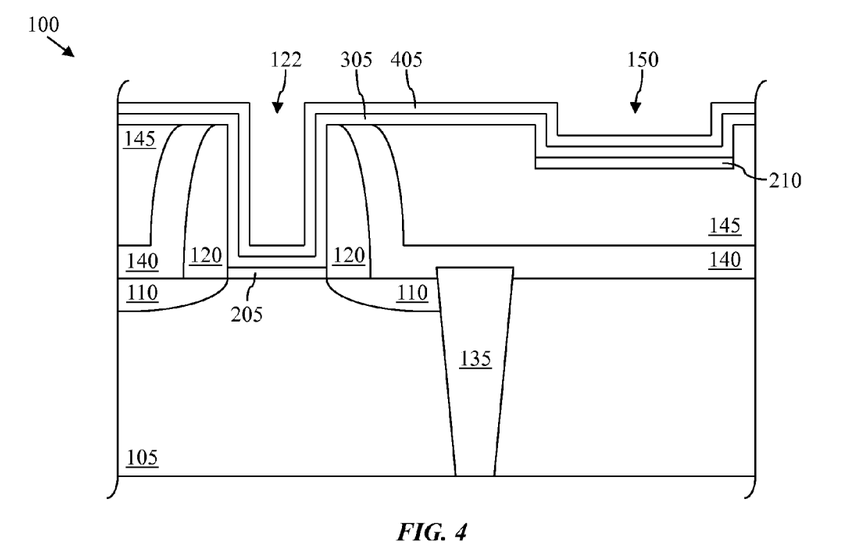
FIG. 4 is a schematic view of the apparatus shown in FIG. 3 in a subsequent stage of manufacture according to one or more aspects of the present disclosure.

FIG. 4 is a schematic view of the apparatus 100 shown in FIG. 3 in a subsequent stage of manufacture according to one or more aspects of the present disclosure. The apparatus 100 also comprises a second structural layer 405 formed over the first structural layer 305. The second structural layer 405 also lines the internal surfaces of the openings 122 and 150 defined by the first structural layer 305. The second structural layer 405 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the first structural layer 405. The second structural layer 405 may be formed by CVD and/or other processes, and may have a thickness ranging between about ten angstroms and about 200 angstroms, although other thicknesses are also within the scope of the present disclosure.

Figure 5:
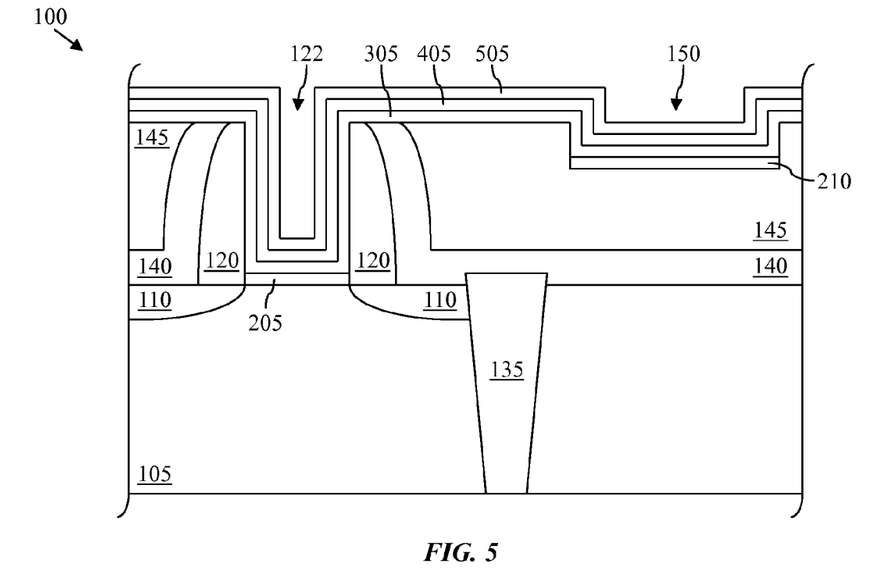
FIG. 5 is a schematic view of the apparatus shown in FIG. 4 in a subsequent stage of manufacture according to one or more aspects of the present disclosure.

FIG. 5 is a schematic view of the apparatus 100 shown in FIG. 4 in a subsequent stage of manufacture according to one or more aspects of the present disclosure. The apparatus 100 also comprises a third structural layer 505 formed over the second structural layer 405. The third structural layer 505 also lines the internal surfaces of the openings 122 and 150 defined by the second structural layer 405. The third structural layer 505 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the second structural layer 405. The third structural layer 505 may be formed by CVD and/or other processes, and may have a thickness ranging between about ten angstroms and about 200 angstroms, although other thicknesses are also within the scope of the present disclosure.

Figure 6:
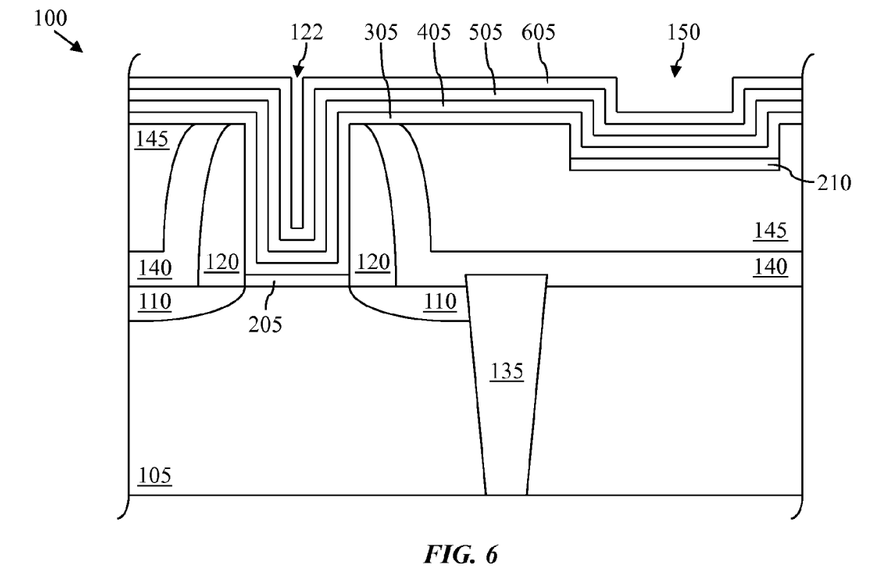
FIG. 6 is a schematic view of the apparatus shown in FIG. 5 in a subsequent stage of manufacture according to one or more aspects of the present disclosure.

FIG. 6 is a schematic view of the apparatus 100 shown in FIG. 5 in a subsequent stage of manufacture according to one or more aspects of the present disclosure. The apparatus 100 also comprises a fourth structural layer 605 formed over the third structural layer 505. The fourth structural layer 605 also lines the internal surfaces of the openings 122 and 150 defined by the third structural layer 505. The fourth structural layer 605 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure, but may have a composition that substantially differs from that of the third structural layer 505. The fourth structural layer 605 may be formed by CVD and/or other processes, and may have a thickness ranging between about ten angstroms and about 200 angstroms, although other thicknesses are also within the scope of the present disclosure.

The composition and order of the structural layers 305, 405, 505, and 605 may vary within the scope of the present disclosure. For example, one or more of the structural layers 305, 405, 505, and 605 may be utilized as a barrier layer preventing diffusion between adjacent ones of the structural layers 305, 405, 505, and 605. Such barrier layers may comprise tantalum nitride and/or titanium nitride, although other materials are also possible. One or more of the structural layers 305, 405, 505, and 605 may also or alternatively be utilized as an adhesion layer preventing delamination of adjacent ones of the structural layers 305, 405, 505, and 605. Such adhesion layers may comprise tantalum nitride and/or titanium nitride, although other materials are also possible. One or more of the structural layers 305, 405, 505, and 605 may also or alternatively be utilized as a high-k dielectric layer providing electrical isolation between adjacent ones of the structural layers 305, 405, 505, and 605. Such high-k dielectric layers may comprise hafnium oxide and/or lanthanum oxide, although other materials are also possible. One more of the structural layers 305, 405, 505, and 605 may also or alternatively be employed for its selective etching relative to others of the structural layers 305, 405, 505, and 605. For example, silicon nitride and silicon oxide may be utilized for two (or more) of the structural layers 305, 405, 505, and 605 to take advantage of the different etching selectivity of these two materials.

Figure 7:
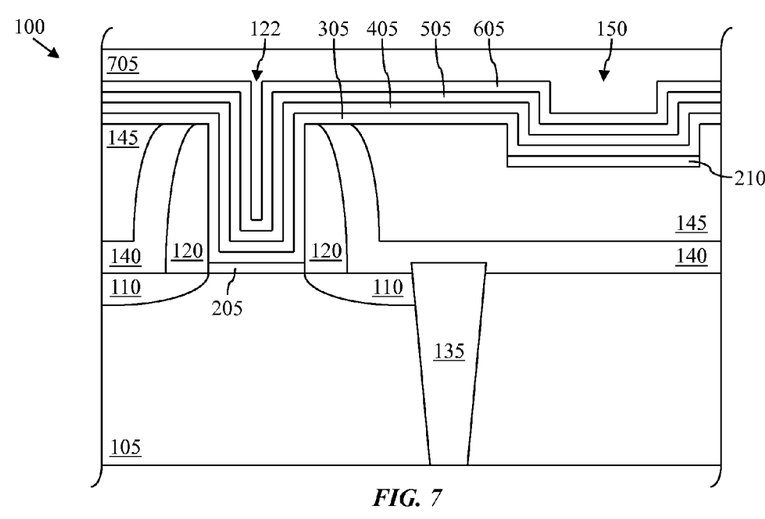
FIG. 7 is a schematic view of the apparatus shown in FIG. 6 in a subsequent stage of manufacture according to one or more aspects of the present disclosure.

FIG. 7 is a schematic view of the apparatus 100 shown in FIG. 6 in a subsequent stage of manufacture according to one or more aspects of the present disclosure. The apparatus 100 also comprises a conductive material 705 formed over the fourth structural layer 605. The conductive material 705 fills the volume remaining in the openings 122 and 150 defined by the fourth structural layer 605. The conductive material 705 may comprise one or more of aluminum, cobalt, copper, and tungsten, among other materials within the scope of the present disclosure, and may be formed by CVD, spin-on coating, sputtering, and/or other processes. The thickness of the conductive material 705 within the opening 150 may range between about 200 angstroms and about 450 angstroms, although other thicknesses are also within the scope of the present disclosure.

Figure 8:
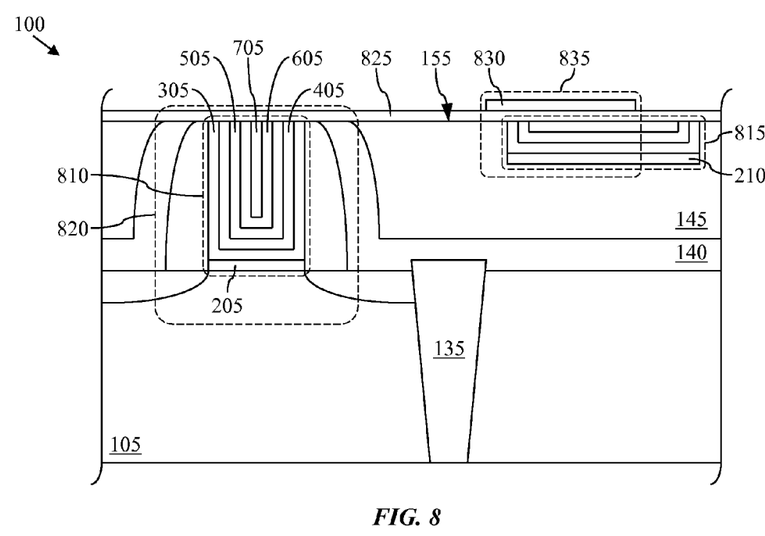
FIG. 8 is a schematic view of the apparatus shown in FIG. 7 in a subsequent stage of manufacture according to one or more aspects of the present disclosure.

FIG. 8 is a schematic view of the apparatus 100 shown in FIG. 7 in a subsequent stage of manufacture according to one or more aspects of the present disclosure, in which one or more CMP and/or other processes have been utilized to remove portions of the structural layers 305, 405, 505, and 605 and the conductive material 705 to approximately the level of the upper surface 155 of the interlayer dielectric layer 145. Consequently, a first multi-layer structure 810 remains in the opening 122, and a second multi-layer structure 815 remains in the opening 150. The first multi-layer structure 810 comprises a gate electrode comprising a central gate electrode formed from the conductive material 705 and a plurality of gate electrode layers collectively interposing the central gate electrode and the spacers 120. This gate electrode completes a field effect transistor (FET) 820, in conjunction with the source/drain regions 110, the channel region 130 in the substrate 105, and the dielectric film 205 operating as a gate dielectric layer. The second multi-layer structure 815 comprises a resistor that is electrically isolated from the FET 820 by the interlayer dielectric layer 145, the contact etching stop layer 140, and the isolation structure 135.

As also shown in FIG. 8, the apparatus 100 also comprises a dielectric film 825 formed over the first multi-layer structure 810, the second multi-layer structure 815, and the upper surface 155 of the interlayer dielectric layer 145. The dielectric film 825 may comprise a high-k dielectric material such as hafnium oxide, zirconium oxide, and/or other materials, and may be formed by CVD, spin-on coating, and/or other processes. The thickness of the dielectric film 825 may range between about 1.5 nm and about 3.0 nm, although other thicknesses are also within the scope of the present disclosure.

An electrode 830 is formed over the dielectric film 825 over a portion of the projected perimeter of the second multi-layer structure 815 and perhaps an additional portion of the dielectric film 825. The electrode 830 may comprise one or more of titanium nitride, tantalum nitride, titanium, titanium aluminum, hafnium oxide, lanthanum oxide, silicon oxide, silicon nitride, and silicon oxynitride, among other materials within the scope of the present disclosure. Fabrication of the electrode 830 may comprise patterned or blanket deposition by CVD, spin-on coating, and/or other processes, perhaps followed by one or more etching and/or other patterning processes. The thickness of the electrode 830 may range between about 5 nm and about 10 nm, although other thicknesses are also within the scope of the present disclosure.

Fabrication of the dielectric film 825 and the electrode 830 completes the formation of a metal-insulator-metal (MIM) capacitor 835. That is, the MIM capacitor 835 comprises the electrode 830, the portion of the dielectric film 825 interposing the electrode 830 and the second multi-layer structure 815, and one or more conductive layers of the second multi-layer structure 815. Moreover, the MIM capacitor 835 has been formed integral to the FEOL processing, instead of as part of the BEOL processing, and thus before any subsequently fabricated portions of an overlying interconnect structure. That is, the manufacture of the apparatus 100 according to aspects of the present disclosure may integrate formation of the MIM capacitor 835 into the formation of the FET 820 and the resistor formed by the second multi-layer structure 815, perhaps without requiring additional masks and/or process steps beyond those already being utilized to form the FET 820 and the resistor formed by the second multi-layer structure 815. Such integration may reduce the complexity of manufacturing, wiring, routing, and/or other processing, and/or may allow for a larger surface area available for capacitor and/or resistor layout. One or more aspects of the present disclosure may also or alternatively allow for flexibility in the interconnection of transistors, capacitors, and/or resistors fabricated during FEOL processing. For example, various interconnection schemes for the MIM capacitor 835 and the resistor formed by the second multi-layer structure 815 may reduce or eliminate the additional routing previously required to connect such elements, whether in series, parallel, or otherwise.

Figure 9:
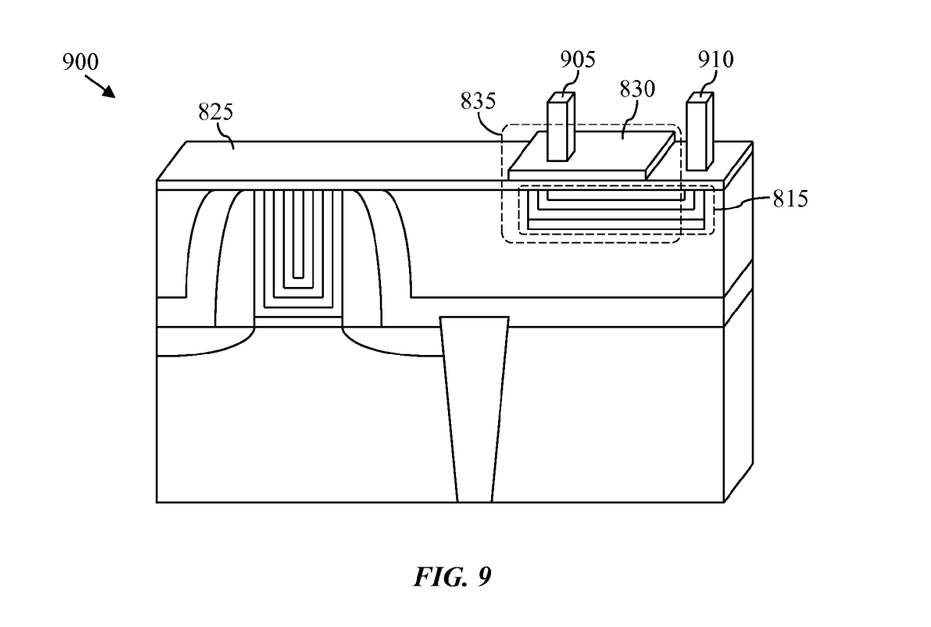
FIG. 9 is a schematic view of at least a portion of apparatus according to one or more aspects of the present disclosure.

For example, FIG. 9 is a schematic view of an example embodiment of the apparatus 100 shown in FIG. 8, herein designated by reference numeral 900. In addition to the above-described elements of the apparatus 100, the apparatus 900 also comprises a first connection 905 and a second connection 910. The first connection 905 lands on the electrode 830. However, the second connection 910 is positioned outside the perimeter of the electrode 830, and extends through the dielectric film 825 to the second multi-layer structure 815. Accordingly, the MIM capacitor 835 and the resistor formed by the second multi-layer structure 815 may be electrically connected in series.

Figure 10:
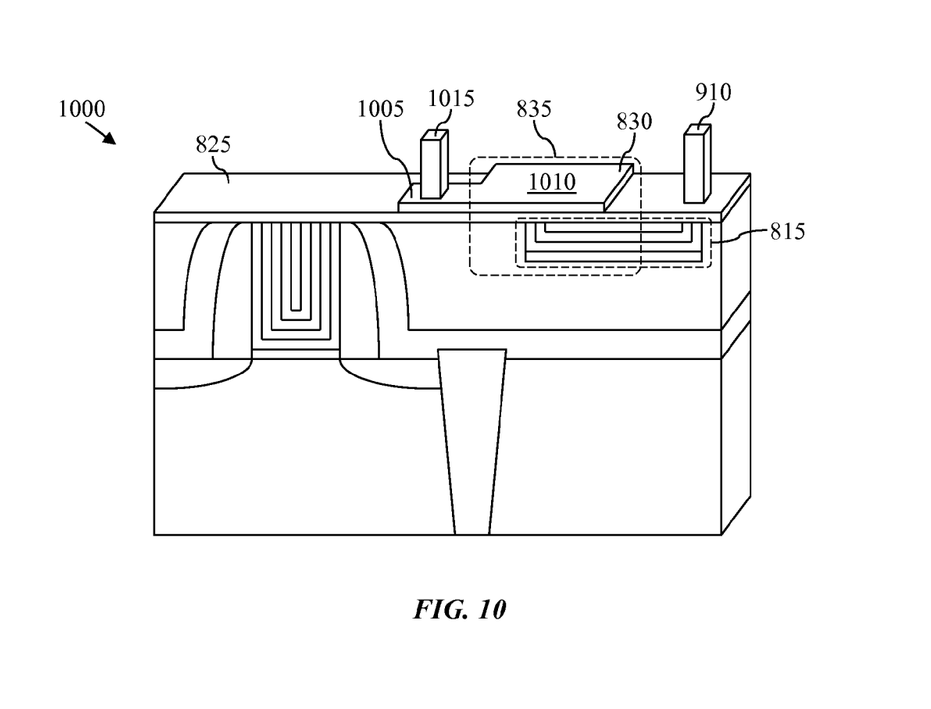
FIG. 10 is a schematic view of at least a portion of apparatus according to one or more aspects of the present disclosure.

FIG. 10 is a schematic view of another example embodiment of the apparatus 100 shown in FIG. 8, herein designated by reference numeral 1000. The apparatus 1000 is substantially similar to the apparatus 100 with the following exceptions. For example, the electrode 830 of the apparatus 1000 includes an additional portion 1005 extending laterally away from a body portion 1010 along the dielectric film 825. This additional portion 1005 may be sized to be operable as an additional resistor, and this additional resistor and the electrode 830 may collectively be a discrete member formed in a single layer. The apparatus 1000 comprises the second connection 910 shown in FIG. 9, extending through the dielectric film 825 and landing on the resistor formed by the second multi-layer structure 815. However, the apparatus 1000 further comprises a connection 1015 landing on the additional resistor formed by the additional portion 1005 of the electrode 830. Accordingly, the MIM capacitor 835 may be electrically connected in series between the resistor formed by the second multi-layer structure 815 and the additional resistor formed by the additional portion 1005 of the electrode 830.

Figure 11:
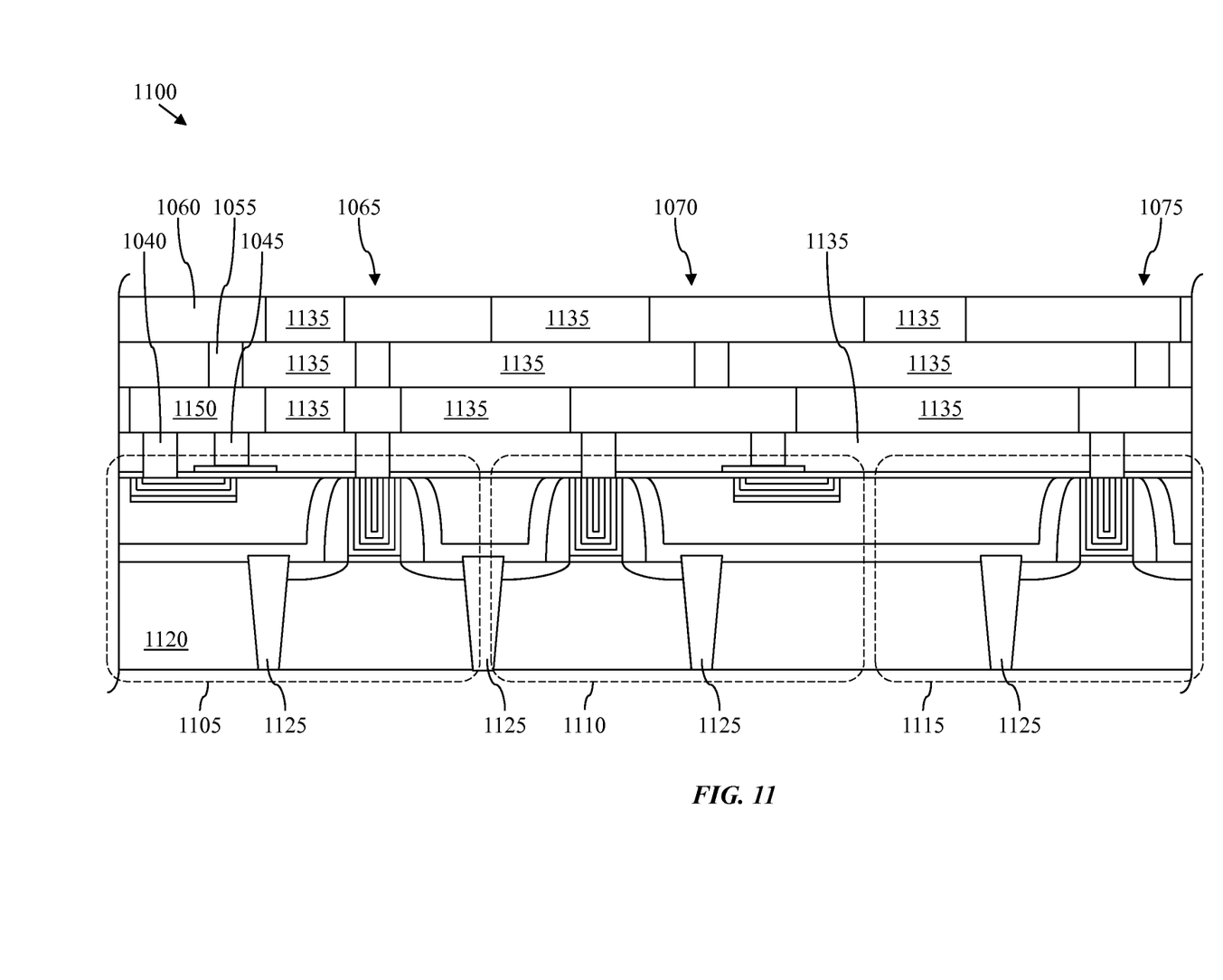
FIG. 11 is a schematic view of at least a portion of apparatus according to one or more aspects of the present disclosure.

FIG. 11 is a schematic view of at least a portion of an apparatus 1100 according to one or more aspects of the present disclosure. The apparatus 1100 may be or comprise an integrated circuit device, which is one environment in which the apparatus 100 shown in FIG. 8, the apparatus 900 shown in FIG. 9, the apparatus 1000 shown in FIG. 10, and/or other apparatus within the scope of the present disclosure may be implemented. For example, the illustrated portion of the apparatus 1100 comprises at least portions of three microelectronic devices 1105, 1110, and 1115, one or more of which may be substantially similar to the apparatus 100 shown in FIG. 8, the apparatus 900 shown in FIG. 9, the apparatus 1000 shown in FIG. 10, and/or other apparatus within the scope of the present disclosure. However, the apparatus 1100 may also comprise one or more devices other than those shown in FIGS. 1-10 or otherwise within the scope of the present disclosure.

The microelectronic devices 1105, 1110, and 1115 are formed substantially simultaneously from and/or on a single substrate 1120, which may be substantially similar to the substrate 105 shown in FIGS. 1-10. One or more isolation structures 1125 that may be formed between ones of the microelectronic devices 1105, 1110, and 1115 may be substantially similar to the isolation structure 135 shown in FIGS. 1-10.

The apparatus 1100 also comprises series of vias, traces, and/or other interconnects extending along and/or through one or more dielectric layers 1135 to one or more of the microelectronic devices 1105, 1110, and/or 1115. The interconnects may comprise copper, tungsten, gold, aluminum, and/or other materials, and may be formed by CVD and/or other processes. The dielectric layers 1135 may be substantially similar to the one or more interlayer dielectric layers 145 shown in FIGS. 1-10.

In the example embodiment depicted in FIG. 11, the interconnects include a via 1140 landing on the resistor formed by one of the multi-layer structures of the microelectronic device 1105, another via 1145 landing on the MIM capacitor electrode of the microelectronic device 1105, and a trace 1150 interconnecting the vias 1140 and 1145. Another via 1155 connects the trace 1150 to another trace 1160, such that the components of the microelectronic device 1105 may be interconnected in parallel to one or more other portions of the apparatus 1100. Similarly, the vias and traces of another interconnection series 1165 connect the multi-layer gate electrode of the microelectronic device 1105 to one or more other portions of the apparatus 1100, an interconnection series 1170 connects the multi-layer gate electrode and the MIM capacitor electrode of the microelectronic device 1110 to one or more other portions of the apparatus 1100, and another interconnection series 1175 connects the multi-layer gate electrode of the microelectronic device 1115 to one or more other portions of the apparatus 1100. Of course, the scope of the present disclosure is not limited to the example interconnections depicted in FIG. 11, and indeed includes myriad other interconnection schemes.

In view of the entirety of the present disclosure, including FIGS. 1-11, a person having ordinary skill in the art should readily recognize that the present disclosure introduces a method comprising: forming first and second multi-layer structures within respective openings in at least one dielectric layer formed over a semiconductor substrate, wherein the first multi-layer structure comprises a gate electrode, and wherein the second multi-layer structure comprises a resistor and a first electrode of a metal-insulator-metal (MIM) capacitor structure; and completing the MIM capacitor structure by: forming a dielectric film on the first multi-layer structure, the second multi-layer structure, and the at least one dielectric layer; and forming a second electrode on the dielectric film. The openings may comprise: a first opening comprising the first multi-layer structure; and a second opening comprising the second multi-layer structure. The method may further comprise forming the first and second openings. Forming the first and second multi-layer structures may comprise: forming a dielectric film on the bottom of each of the first and second openings; forming a first layer lining the first and second openings substantially simultaneously, including on the dielectric film at the bottom of the first and second openings; forming a plurality of additional layers each simultaneously lining the first and second openings over the immediately previously formed layer lining the first and second openings; filling the multi-layer lined first and second openings with a conductive material; and planarizing to remove portions of the first layer, each of the plurality of additional layers, and the conductive material to expose the at least one dielectric layer.

The method may further comprise forming an interlayer dielectric layer over the dielectric film and the second electrode; forming a first conductive via extending through the interlayer dielectric layer and the dielectric film to contact the gate electrode; forming a second conductive via extending through the interlayer dielectric layer to contact the second electrode; and forming a third conductive via extending through the interlayer dielectric layer and the dielectric film to contact the resistor. The first and third conductive vias may not extend through or otherwise contact the second electrode. The method may further comprise forming an interconnection structure over the interlayer dielectric layer, wherein the interconnection structure may comprise pluralities of additional interlayer dielectric layers, additional vias, and traces, and wherein ones of the pluralities of additional vias and traces may electrically connect ones of the first, second, and third conductive vias. The ones of the pluralities of additional vias and traces and the electrically connected ones of the first, second, and third conductive vias may collectively connect the resistor and the MIM capacitor in series or in parallel. The method may further comprise forming an additional resistor on the dielectric film simultaneously with forming the second electrode, and wherein the ones of the pluralities of additional vias and traces and the electrically connected ones of the first, second, and third conductive vias may collectively connect the MIM capacitor in series between the resistor and the additional resistor. The additional resistor and the second electrode may be collectively formed as a discrete member from a single layer.

Forming the first multi-layer structure may comprise forming: at least one gate dielectric layer on the semiconductor substrate; a central gate electrode; and a plurality of gate electrode layers collectively interposing the at least one gate dielectric layer and the central gate electrode. Each neighboring pair of the plurality of gate electrode layers may comprise different materials. The central gate electrode may comprise a material selected from a first group consisting of aluminum, cobalt, copper, and tungsten, and each of the plurality of gate electrode layers may comprise a material selected from a second group consisting of titanium nitride, tantalum nitride, titanium, titanium aluminum, hafnium oxide, lanthanum oxide, silicon oxide, silicon nitride, and silicon oxynitride.

The second multi-layer structure may comprise a plurality of layers forming the resistor, and each neighboring pair of the plurality of layers may comprise different materials. Each of the plurality of layers forming the resistor may individually comprise a material selected from the group consisting of titanium nitride, tantalum nitride, titanium, titanium aluminum, hafnium oxide, lanthanum oxide, silicon oxide, silicon nitride, and silicon oxynitride.

The present disclosure also introduces an apparatus comprising: a gate electrode comprising a first plurality of layers collectively formed over a semiconductor substrate; a resistor comprising a second plurality of layers collectively formed over the semiconductor substrate, wherein the first and second pluralities of layers have the same number of layers, wherein each of the second plurality of layers has substantially the same thickness and composition as a respective one of the first plurality of layers, and wherein the positional order of each layer within the second plurality of layers is the same as the positional order of each layer within the first plurality of layers; and a metal-insulator-metal (MIM) capacitor having a first electrode comprising at least one of the second plurality of layers, an insulator overlying at least a portion of the resistor, and a second electrode overlying the insulator.

The apparatus may further comprise: an interlayer dielectric layer over the gate electrode, the resistor, and the MIM capacitor; a first conductive via extending through the interlayer dielectric layer and the insulator to contact the gate electrode; a second conductive via extending through the interlayer dielectric layer to contact the second electrode of the MIM capacitor; and a third conductive via extending through the interlayer dielectric layer and the insulator to contact the resistor. The apparatus may further comprise an interconnection structure over the interlayer dielectric layer, wherein the interconnection structure may comprise: a plurality of additional interlayer dielectric layers; a plurality of additional conductive vias; and a plurality of traces. Ones of the plurality of additional conductive vias and the plurality of traces may electrically connect ones of the first, second, and third conductive vias. Ones of the plurality of additional vias and the plurality of traces and the electrically connected ones of the first, second, and third conductive vias may collectively connect the resistor and the MIM capacitor in series or in parallel. The apparatus may further comprise an additional resistor comprising a portion of the second electrode, and the ones of the plurality of additional vias and the plurality of traces and the electrically connected ones of the first, second, and third conductive vias may collectively connect the MIM capacitor in series between the resistor and the additional resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same aspects of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

What is claimed is:

1. A method, comprising:
   forming first and second multi-layer structures within respective openings in at least one dielectric layer formed over a semiconductor substrate, wherein the first multi-layer structure comprises a gate electrode, and wherein the second multi-layer structure comprises a resistor and a first electrode of a metal-insulator-metal (MIM) capacitor structure; and
   completing the MIM capacitor structure by:
   forming a dielectric film on the first multi-layer structure, the second multi-layer structure, and the at least one dielectric layer; and
   forming a second electrode on the dielectric film.

2. The method of claim 1 wherein the openings comprise:
   a first opening comprising the first multi-layer structure; and
   a second opening comprising the second multi-layer structure; and
   the method further comprises forming the first and second openings.

3. The method of claim 2 wherein forming the first and second multi-layer structures comprises:
   forming a dielectric film on the bottom of each of the first and second openings;
   forming a first layer lining the first and second openings substantially simultaneously, including on the dielectric film at the bottom of the first and second openings;
   forming a plurality of additional layers each simultaneously lining the first and second openings over the immediately previously formed layer lining the first and second openings;
   filling the multi-layer lined first and second openings with a conductive material; and
   planarizing to remove portions of the first layer, each of the plurality of additional layers, and the conductive material to expose the at least one dielectric layer.

4. The method of claim 1 further comprising:
   forming an interlayer dielectric layer over the dielectric film and the second electrode;
   forming a first conductive via extending through the interlayer dielectric layer and the dielectric film to contact the gate electrode;
   forming a second conductive via extending through the interlayer dielectric layer to contact the second electrode; and
   forming a third conductive via extending through the interlayer dielectric layer and the dielectric film to contact the resistor.

5. The method of claim 4 wherein the first and third conductive vias do not extend through or otherwise contact the second electrode.

6. The method of claim 4 further comprising forming an interconnection structure over the interlayer dielectric layer, wherein the interconnection structure comprises pluralities of additional interlayer dielectric layers, additional vias, and traces, and wherein ones of the pluralities of additional vias and traces electrically connect ones of the first, second, and third conductive vias.

7. The method of claim 6 wherein the ones of the pluralities of additional vias and traces and the electrically connected ones of the first, second, and third conductive vias collectively connect the resistor and the MIM capacitor in series.

8. The method of claim 6 wherein the ones of the pluralities of additional vias and traces and the electrically connected ones of the first, second, and third conductive vias collectively connect the resistor and the MIM capacitor in parallel.

9. The method of claim 6 further comprising forming an additional resistor on the dielectric film simultaneously with forming the second electrode, and wherein the ones of the pluralities of additional vias and traces and the electrically connected ones of the first, second, and third conductive vias collectively connect the MIM capacitor in series between the resistor and the additional resistor.

10. The method of claim 9 wherein the additional resistor and the second electrode are collectively formed as a discrete member from a single layer.

11. The method of claim 1 wherein:
    forming the first multi-layer structure comprises forming:
    at least one gate dielectric layer on the semiconductor substrate;
    a central gate electrode; and
    a plurality of gate electrode layers collectively interposing the at least one gate dielectric layer and the central gate electrode; and
    each neighboring pair of the plurality of gate electrode layers comprises different materials.

12. The method of claim 11 wherein:
    the central gate electrode comprises a material selected from a first group consisting essentially of aluminum, cobalt, copper, tungsten, and combinations thereof; and
    each of the plurality of gate electrode layers comprises a material selected from a second group consisting essentially of: titanium nitride, tantalum nitride, titanium, titanium aluminum, hafnium oxide, lanthanum oxide, silicon oxide, silicon nitride; silicon oxynitride, and combinations thereof.

13. The method of claim 1 wherein the second multi-layer structure comprises a plurality of layers forming the resistor, and wherein each neighboring pair of the plurality of layers comprises different materials.

14. The method of claim 13 wherein each of the plurality of layers forming the resistor individually comprises a material selected from the group consisting essentially of: titanium nitride; tantalum nitride, titanium, titanium aluminum, hafnium oxide, lanthanum oxide, silicon oxide, silicon nitride, silicon oxynitride, and combinations thereof.

15. An apparatus, comprising:
    a gate electrode comprising a first plurality of layers collectively formed over a semiconductor substrate;
    a resistor comprising a second plurality of layers collectively formed over the semiconductor substrate, wherein the first and second pluralities of layers have the same number of layers, wherein each of the second plurality of layers has substantially the same thickness and composition as a respective one of the first plurality of layers, and wherein the positional order of each layer within the second plurality of layers is the same as the positional order of each layer within the first plurality of layers; and
    a metal-insulator-metal (MIM) capacitor having a first electrode comprising at least one of the second plurality of layers, an insulator overlying at least a portion of the resistor, and a second electrode overlying the insulator.

16. The apparatus of claim 15 further comprising:
    an interlayer dielectric layer over the gate electrode, the resistor, and the MIM capacitor;

a first conductive via extending through the interlayer dielectric layer and the insulator to contact the gate electrode;

a second conductive via extending through the interlayer dielectric layer to contact the second electrode of the MIM capacitor; and a third conductive via extending through the interlayer dielectric layer and the insulator to contact the resistor.

17. The apparatus of claim 16 further comprising an interconnection structure over the interlayer dielectric layer, wherein the interconnection structure comprises:

a plurality of additional interlayer dielectric layers;

a plurality of additional conductive vias; and a plurality of traces; and wherein ones of the plurality of additional conductive vias and the plurality of traces electrically connect ones of the first, second, and third conductive vias.

18. The apparatus of claim 17 wherein the ones of the plurality of additional vias and the plurality of traces and the electrically connected ones of the first, second, and third conductive vias collectively connect the resistor and the MIM capacitor in series.

19. The apparatus of claim 17 wherein the ones of the plurality of additional vias and the plurality of traces and the electrically connected ones of the first, second, and third conductive vias collectively connect the resistor and the MIM capacitor in parallel.

20. The apparatus of claim 17 further comprising an additional resistor comprising a portion of the second electrode, and wherein the ones of the plurality of additional vias and the plurality of traces and the electrically connected ones of the first, second, and third conductive vias collectively connect the MIM capacitor in series between the resistor and the additional resistor.

* * * * *